United States Patent [19]
Goto

[11] Patent Number: 5,633,616
[45] Date of Patent: May 27, 1997

[54] THIN FILM SAW FILTER INCLUDING DOPED ELECTRODES

[75] Inventor: Seiki Goto, Itami, Japan

[73] Assignee: Mitsubishi Denki Kabushiki Kaisha, Tokyo, Japan

[21] Appl. No.: 535,831

[22] Filed: Sep. 28, 1995

[30] Foreign Application Priority Data

Oct. 7, 1994 [JP] Japan ................................. 6-243686

[51] Int. Cl.$^6$ ..................................................... H03H 9/64
[52] U.S. Cl. ........................................ 333/193; 310/313 A
[58] Field of Search ............................. 333/193, 194, 333/195, 196; 310/313 A, 313 R

[56] References Cited

U.S. PATENT DOCUMENTS

| 3,827,002 | 7/1974 | Chao | 333/193 |
|---|---|---|---|
| 4,025,876 | 5/1977 | Fletcher et al. | 333/195 X |
| 4,531,107 | 7/1985 | Okamoto et al. | 333/194 |
| 5,061,870 | 10/1991 | Ieki et al. | 333/193 X |
| 5,432,393 | 7/1995 | Davenport | 333/193 X |

FOREIGN PATENT DOCUMENTS 0169218 9/1984 Japan ..................................... 333/193

*Primary Examiner*—Benny Lee
*Assistant Examiner*—Justin P. Bettendorf
*Attorney, Agent, or Firm*—Leydig, Voit & Mayer

[57] ABSTRACT

A surface acoustic wave (SAW) filter includes a monocrystalline substrate, such as sapphire, having a surface and an epitaxial piezoelectric layer disposed on the surface of the substrate. The piezoelectric layer is a semiconductor material that is relatively heavily doped in regions at the interface between the substrate and the piezoelectric layer. The heavily doped regions functions as electrodes. Because the electrodes at the interface are made of the same material as the piezoelectric layer, there is no disturbance of the crystallinity of the piezoelectric layer during its deposition and thermal stresses during use are substantially reduced.

6 Claims, 8 Drawing Sheets

THIN FILM SAW FILTER INCLUDING DOPED ELECTRODES

FIELD OF THE INVENTION

The present invention relates to surface acoustic wave (hereinafter referred to as SAW) filters and, more particularly, to materials, structures, and fabricating methods of SAW filter electrodes which are disposed at an interface between a substrate and a piezoelectric layer and do not adversely affect the crystal structure of the piezoelectric layer.

BACKGROUND OF THE INVENTION

Figure 7:
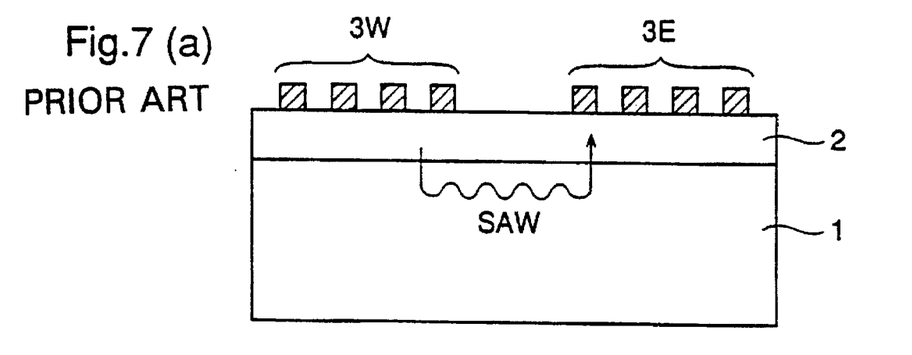
FIGS. 7(a) and 7(b) are sectional views illustrating thin film SAW filters according to the prior art.
FIG. 7(c) is a top plan view of the SAW filter shown in FIG. 7(a).

FIGS. 7(a) and 7(b) are cross-sectional views illustrating prior art thin film SAW filters. In these figures, reference numeral 1 designates a substrate comprising a material providing a high propagation velocity for an oscillatory wave, such as amorphous $Al_2O_3$ (hereinafter referred to as $\alpha$-$Al_2O_3$) sometimes referred to as sapphire. In the structure shown in FIG. 7(a), a piezoelectric layer 2 comprising ZnO or AlN is disposed on the substrate 1. This piezoelectric layer 2 is epitaxially grown on the substrate 1 by vacuum evaporation or sputtering. Multifinger electrodes 3W and 3E comprising a conductive material, such as Al or Au, are disposed on the piezoelectric layer 2. In the structure shown in FIG. 7(b), the multifinger electrodes 3W and 3E are disposed on the surface of the substrate 1, and a piezoelectric layer 2a comprising an orientation film covers the surface of the substrate 1 including the multifinger electrodes 3W and 3E.

FIG. 7(c) is a top plan view of the SAW filter shown in FIG. 7(a). The multifinger electrode 3W comprises a pair of doublefinger electrodes 3w and 3w' and the multifinger electrode 3E comprises a pair of doublefinger electrodes 3e and 3e'. Reference character d1 denotes the width of the finger portion of the multifinger electrode, and reference character d2 denotes the interval between adjacent finger portions.

A method of fabricating the thin film SAW filter shown in FIG. 7(a) is illustrated in FIGS. 8(a)–8(f).

Figure 8:
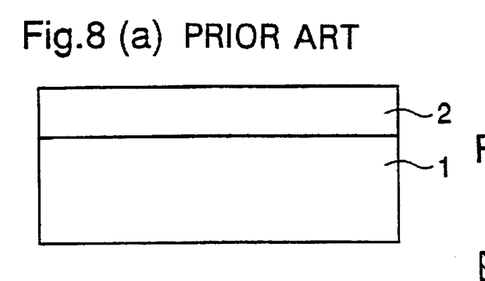
FIGS. 8(a)–8(f) are sectional views illustrating process steps in a method of fabricating the SAW filter shown in FIG. 7(a).

Initially, as illustrated in FIG. 8(a), the piezoelectric layer 2 is epitaxially grown on the substrate 1 and, thereafter, as illustrated in FIG. 8(b), an electrode metal 3, such as Al or Au, is deposited on the piezoelectric layer 2 by vacuum evaporation.

Then, a resist 4 is deposited over the electrode metal layer 3 (FIG. 8(c)) and patterned (FIG. 8(d)). Using the patterned resist 4a as a mask, the electrode metal layer 3 is etched (FIG. 8(e)), followed by removal of the patterned resist 4a, thereby producing the multifinger electrodes 3W and 3E (FIG. 8(f)). In the step of FIG. 8(e), if the piezoelectric layer 2 comprises an amphoteric oxide, the metal layer 3 must be etched by dry etching, such as ion milling using Ar gas.

A description is given of the operation of the SAW filter.

When a high-frequency signal is applied across the doublefinger electrodes 3w and 3w', an oscillation having a resonance frequency f that is represented by the following equation occurs.

$$f = V_p/2(d1+d2)$$

where $V_p$ is the propagation velocity of the oscillatory wave, d1 is the width of each finger part of the multifinger electrode, and d2 is the interval between adjacent finger parts.

Only a surface acoustic wave (SAW) having the resonance frequency f is excited due to the resonance effect utilizing the piezoelectric behavior of the piezoelectric layer 2. This oscillatory wave is propagated through the substrate 1 that provides a high propagation velocity for the oscillator wave and reaches the multifinger electrode 3E. The oscillatory wave is converted into an electrical signal by the electrodes 3e and 3e' of the multifinger electrode 3E, whereby only the electrical signal having the excited frequency f is output.

In order to increase the resonance frequency f, it is necessary to increase the propagation velocity $V_p$ of the SAW in the medium. Therefore, the medium should be a material having a sufficient enough piezoelectric property to convert the electrical signal into the SAW and providing a high propagation velocity for the oscillatory wave. However, materials having such properties are limited. Therefore, in the prior art SAW filter shown in FIG. 7(a), the monocrystalline layer 2 comprising ZnO or AlN having a sufficient piezoelectric property is grown on the $\alpha$-$Al_2O_3$ substrate 1 having no piezoelectric property but providing a high propagation velocity ($V_p$) for the oscillatory wave, and the multifinger electrodes 3W and 3E are produced on the piezoelectric monocrystalline layer 2. Alternatively, as shown in FIG. 7(b), the multifinger electrodes 3W and 3E are produced on the $\alpha$-$Al_2O_3$ substrate 1, and the electrodes 3W and 3E are buried in the piezoelectric layer 2a comprising an orientation film.

In the prior art thin film SAW filter shown in FIG. 7(b), since the multifinger electrodes 3W and 3E are located at the interface between the piezoelectric layer 2a and the substrate 1, the SAW can be propagated from the electrodes directly to the substrate 1 which is the propagation medium. Therefore, the conversion efficiency from the electrical signal to the SAW is high, and the transmission loss in the filter is reduced. However, the material of the piezoelectric layer 2a is limited. That is, since a piezoelectric material has a better piezoelectric property as the crystallinity thereof is improved, a monocrystalline layer epitaxially grown on the substrate 1 is desired for the piezoelectric layer 2a. However, when the piezoelectric layer 2a is epitaxially grown on the substrate 1, the crystallinity of this layer 2a is significantly degraded due to the electrodes 3W and 3E on the substrate 1, and the piezoelectric effect is significantly degraded. Therefore, in the structure shown in FIG. 7(b), only an orientation film having poor piezoelectric property is used for the piezoelectric layer 2a.

On the other hand, in the structure shown in FIG. 7(a) in which the electrodes 3W and 3E are disposed on the epitaxially grown piezoelectric layer 2, the excited SAW oscillates mainly in the horizontal direction in the figure, but deviates from the horizontal direction when it is propagated through the piezoelectric layer 2 to the substrate 1, resulting in a significant attenuation of the SAW. That is, the propagation efficiency of the SAW is reduced by the piezoelectric layer 2.

In the fabricating process of the SAW filter shown in FIGS. 8(a)–8(f), when the multifinger electrodes 3W and 3E are produced, since the etching rate of the piezoelectric layer 2 is higher than the etching rate of the electrode metal 3, it is difficult to control the etching. So, the etching technique is limited to dry etching, such as ion milling with Ar gas.

SUMMARY OF THE INVENTION

It is an object of the present invention to provide a highly efficient thin film SAW filter having electrodes that do not degrade crystallinity of a monocrystalline piezoelectric layer at the interface between the piezoelectric layer and the substrate.

It is another object of the present invention to provide a relatively simple method for fabricating the thin film SAW filter.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a thin-film SAW filter comprises a semiconductor piezoelectric layer epitaxially grown on a substrate, and first electrodes disposed in the piezoelectric layer at the interface between the substrate and the piezoelectric layer, the first electrodes comprising the same semiconductor as the piezoelectric layer, being epitaxially grown on the surface of the substrate, and being doped with a dopant impurity. Therefore, the electrodes can be disposed at the interface between the substrate and the piezoelectric layer without disordering the crystal orientation of the epitaxially grown piezoelectric layer.

According to a second aspect of the present invention, the thin-film SAW filter further includes second electrodes disposed in the piezoelectric layer and spaced apart from the first electrodes, the second electrodes comprising the same semiconductor as the piezoelectric layer and being doped with a dopant impurity. Therefore, the first electrodes can be disposed at the interface between the substrate and the piezoelectric layer and the second electrodes can be disposed within the piezoelectric layer spaced apart from the first electrodes without disordering the crystal orientation of the epitaxially grown piezoelectric layer.

According to a third aspect of the present invention, the thin-film SAW filter further includes surface electrodes disposed on the surface of the piezoelectric layer. Therefore, those electrodes can be disposed at the interface between the substrate and the piezoelectric layer, at a position within the piezoelectric layer and spaced apart from the first electrodes, and on the piezoelectric layer, respectively, without disordering the crystal orientation of the epitaxially grown piezoelectric layer.

According to a fourth aspect of the present invention, in the above-described thin-film SAW filter, the substrate comprises monocrytsalline $\alpha\text{-Al}_2\text{O}_2$ and the piezoelectric layer comprises ZnO.

According to a fifth aspect of the present invention, a method of fabricating a thin-film SAW filter comprises epitaxially growing a semiconductor piezoelectric layer on a substrate; forming a resist film on the piezoelectric layer and patterning the resist film to form a resist mask; and implanting dopant ions into the piezoelectric layer using the resist mask to form first low-resistance electrodes at the interface between the substrate and the piezoelectric layer. Therefore, the electrodes can be produced at the interface between the substrate and the piezoelectric layer without disordering the crystal orientation of the epitaxially grown piezoelectric layer.

According to a sixth aspect of the present invention, a method of fabricating a thin-film SAW filter comprises epitaxially growing a semiconductor electrode layer on a substrate, the electrode layer containing a dopant impurity and having a reduced resistance; forming a resist film on the electrode layer and patterning the resist film to form a resist mask; using the resist mask, etching the electrode layer to form first low-resistance electrodes on the substrate; and epitaxially growing a semiconductor piezoelectric layer covering the low-resistance electrodes. Therefore, the electrodes can be produced at the interface between the substrate and the piezoelectric layer without disordering the crystal orientation of the epitaxially grown piezoelectric layer.

According to a seventh aspect of the present invention, the method of fabricating a thin-film SAW filter further includes epitaxially growing a second semiconductor electrode layer on the piezoelectric layer, the second electrode layer containing a dopant impurity and having a reduced resistance; forming a resist film on the second electrode layer and patterning the resist film to form a resist mask; using the resist mask, etching the second electrode layer to form second electrodes on the piezoelectric layer; and epitaxially growing a second semiconductor piezoelectric layer covering the second electrodes. Therefore, the first electrodes can be produced at the interface between the substrate and the piezoelectric layer and the second electrodes can be produced within the piezoelectric layer spaced apart from the first electrodes without disordering the crystal orientation of the epitaxially grown piezoelectric layer.

According to an eighth aspect of the present invention, the method of fabricating a thin-film SAW filter further includes implanting dopant ions into the piezoelectric layer using a resist mask to form second low-resistance electrodes within the piezoelectric layer and spaced apart from the electrodes at the interface between the substrate and the piezoelectric layer. Therefore, the first electrodes can be produced at the interface between the substrate and the piezoelectric layer and the second electrodes can be produced within the piezoelectric layer spaced apart from the first electrodes, without disordering the crystal orientation of the epitaxially grown piezoelectric layer, in reduced process steps.

According to a ninth aspect of the present invention, the method of fabricating a thin-film SAW filter further includes forming surface electrodes comprising a metal on the piezoelectric layer. Therefore, those electrodes can be produced at the interface between the substrate and the piezoelectric layer, at a position within the piezoelectric layer and spaced apart from the first electrodies, and on the piezoelectric layer, respectively, without disordering the crystal orientation of the epitaxially grown piezoelectric layer.

According to a tenth aspect of the present invention, the method of fabricating a thin-film SAW filter further includes epitaxially growing a surface electrode layer comprising a semiconductor on the piezoelectric layer, the surface electrode layer containing a dopant impurity and having a reduced resistance; forming a resist film on the surface electrode layer and patterning the resist film to form a resist mask; and using the resist mask, etching the surface electrode layer to form surface electrodes on the piezoelectric layer. Therefore, those electrodes can be produced at the interface between the substrate and the piezoelectric layer, at a position within the piezoelectric layer and spaced apart from the first electrodes, and on the piezoelectric layer, respectively, without disordering the crystal orientation of the epitaxially grown piezoelectric layer.

According to an eleventh aspect of the present invention, the method of fabricating a thin-film SAW filter further includes implanting dopant ions into the piezoelectric layer using a resist mask to form low-resistance surface electrodes within a surface region of the piezoelectric layer and spaced apart from the uppermost electrodes in the piezoelectric layer. Therefore, those electrodes can be produced at the interface between the substrate and the piezoelectric layer, at a position within the piezoelectric layer and spaced apart from the first electrodes, and on the piezoelectric layer, respectively, without disordering the crystal orientation of the epitaxially grown piezoelectric layer, in reduced process steps.

DETAILED DESCRIPTION OF THE PREFERRED EMBODIMENTS

[Embodiment 1]

Figure 1:
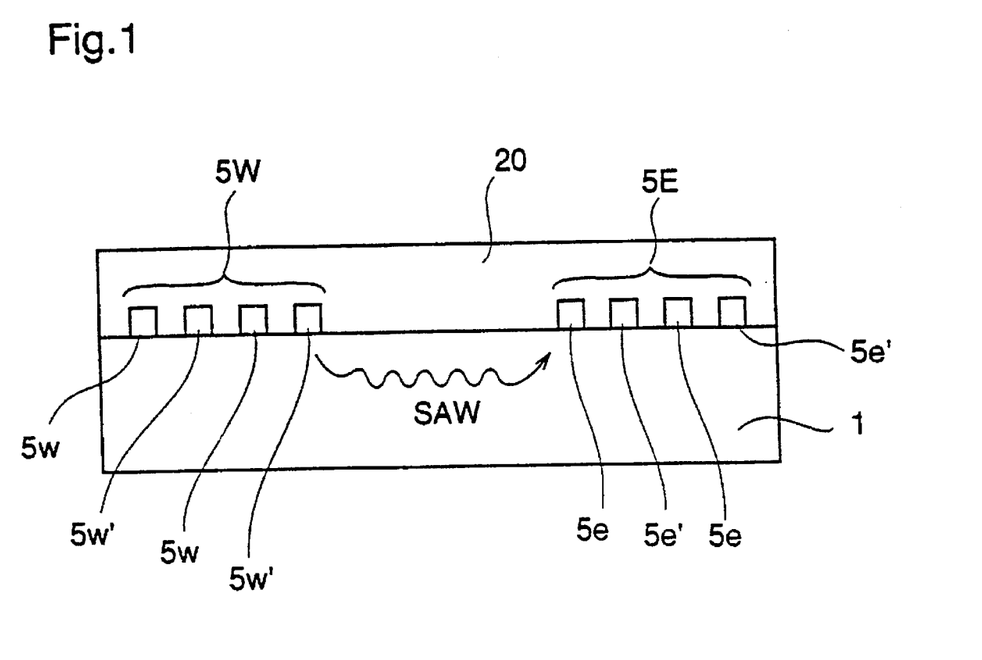
FIG. 1 is a sectional view illustrating a thin film SAW filter in accordance with a first embodiment of the present invention.

FIG. 1 is a sectional view illustrating a thin film SAW filter in accordance with a first embodiment of the present invention. In the figure, reference numeral 1 designates an $\alpha$-$Al_2O_3$ monocrystalline substrate that propagates a SAW at a high velocity. The substrate 1 has a (0001) or (0112) oriented surface. A piezoelectric layer 20 comprising a semiconductor having piezoelectric property, such as ZnO, is disposed on the $\alpha$-$Al_2O_3$ substrate 1. This piezoelectric layer 20 is epitaxially grown on the (0001) or (0112) surface of the $\alpha$-$Al_2O_3$ substrate 1. MuLtifinger electrodes 5W and 5E are disposed on the interface between the substrate 1 and the piezoelectric layer 20. These electrodes 5W and 5E are by adding a dopant impurity, such as Al, to the piezoelectric layer 20 that is epitaxially grown on the substrate 1. The resistivity of these electrodes is about $10^{-3}\Omega/cm$.

A method of fabricating the SAW filter shown in FIG. 1 is illustrated in FIGS. 2(a)–2(e). In these figures, the same reference numerals as in FIG. 1 designate the same or corresponding parts. Reference numeral 4 designates a resist film.

Figure 2:
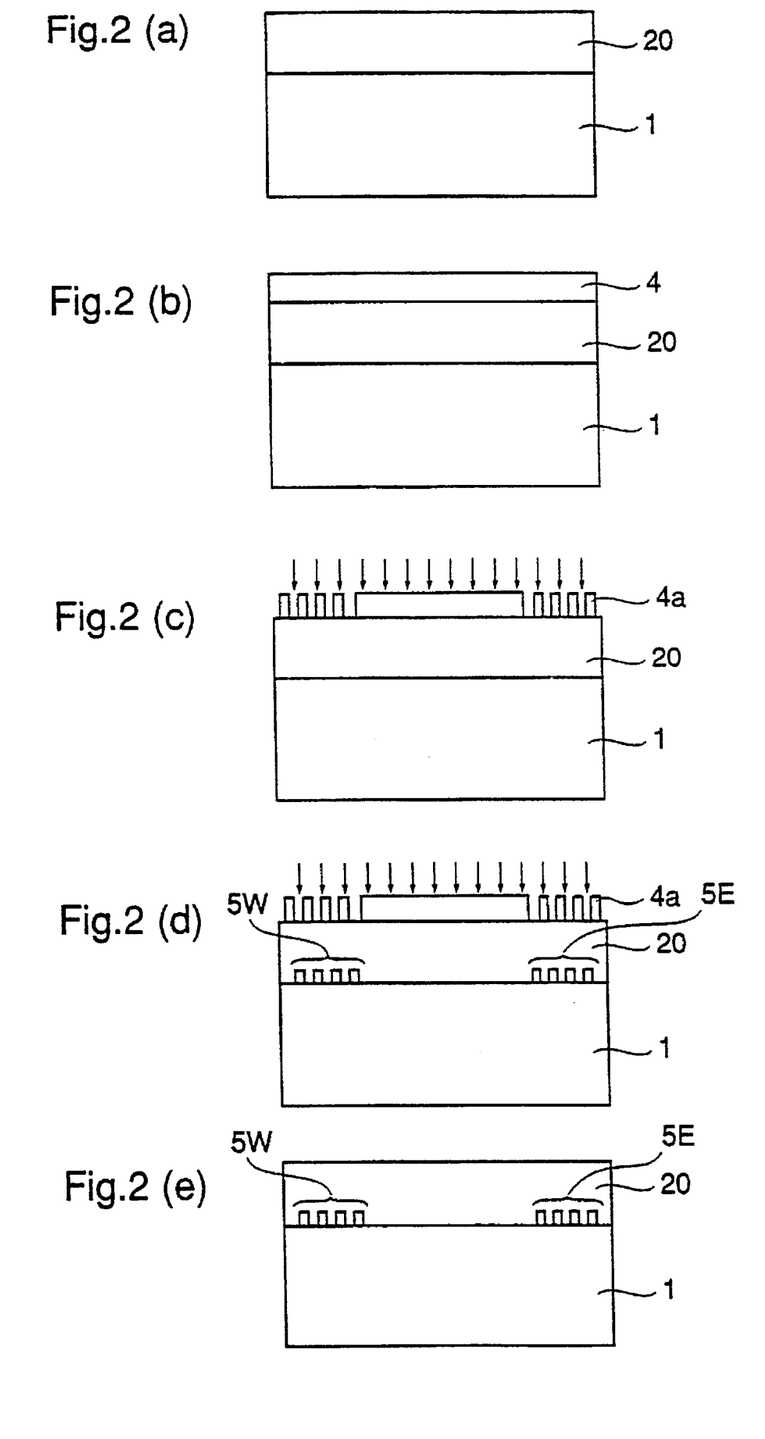
FIGS. 2(a)–2(e) are sectional views illustrating process steps in a method of fabricating the thin film SAW filter shown in FIG. 1.

Initially, the piezoelectric film 20 comprising monocrystalline ZnO is epitaxially grown on the $\alpha$-$Al_2O_3$ substrate 1 to a thickness of several microns (FIG. 2(a)), followed by deposition of the resist film 4 (FIG. 2(b)). The resist film 4 is patterned by exposure and develpment to form a resist pattern 4a for electrodes (FIG. 2(c)).

Using the resist pattern 4a as a mask, dopant ions, such as Al ions, are implanted into the piezoelectric layer 20 to produce the multifinger electrodes 5W and 5E at the interface between the substrate 1 and the piezoelectric layer 20 as shown in FIG. 2(d). The thickness of the electrodes is 0.1 to 1.0 µm. After removal of the resist pattern 4a, the structure is annealed to activate the implanted ions in the electrodes 5W and 5E, thereby reducing the resistance of the electrodes.

The electrodes 5W and 5E produced by implantation of Al ions into the piezoelectric layer 20 have the same crystal orientation as the crystal orientation of the semiconductor of the piezoelectric layer 20. In addition, when ZnO is doped with Al to 0.2 wt %, the resistivity of the Al-doped ZnO is reduced to about $1\times10^{-3}\Omega/cm$.

Since the electrodes 5W and 5E are disposed directly on the substrate 1, when a high-frequency signal applied across the electrodes 5w and 5w' is converted into an SAW and the SAW is excited due to the piezoelectric effect of the piezoelectric layer 20, this SAW can be directly transferred to the substrate 1. In addition, because the electrodes 5W and 5E comprise the same material as the piezoelectric layer 20 and have the same crystal orientation as the piezoelectric layer 20, there is little lattice-mismatch between the piezoelectric layer 20 and the electrodes 5W and 5E, and the crystallinity of the piezoelectric layer 20 is satisfactory. Therefore, undesired degradation in the piezoelectric effect due to poor crystallinity of the piezoelectric layer as in the prior art SAW filter is avoided.

According to the first embodiment of the invention, since the low-resistance electrodes 5W and 5E are produced by implanting a dopant impurity into the piezoelectric semiconductor layer 20, the structure in which those electrodes are located at the interface between the substrate 1 and the piezoelectric layer 20 is realized without degrading the crystallinity of the piezoelectric layer 20. Therefore, when a high-frequency signal applied across the electrodes 5w and 5w' is converted into SAW, this SAW is directly transferred to the substrate 1. In addition, since the electrodes 5W and 5E are portions of the piezoelectric layer 20 that is epitaxially grown on the substrate 1, there is little lattice-mismatch between the piezoelectric layer 20 and the electrodes 5W and 5E, and the crystallinity of the piezoelectric layer 20 is satisfactory. Therefore, unwanted degradation in the piezoelectric effect due to poor crystallinity of the piezoelectric layer 20 is avoided. As a result, a thin SAW filter with improved operating characteristics is realized.

[Embodiment 2]

FIGS. 3(a)–3(f) are sectional views illustrating process steps in another method of fabricating the thin film SAW filter shown in FIG. 1 according to a second embodiment of the present invention. In the figures, the same reference numerals as in FIGS. 2(a)–2(e) designate the same or corresponding parts. Reference numeral 5 designates an electrode layer comprising a low-resistance semiconductor doped with an impurity, such as Al.

A description is given of the fabricating process.

Figure 3:
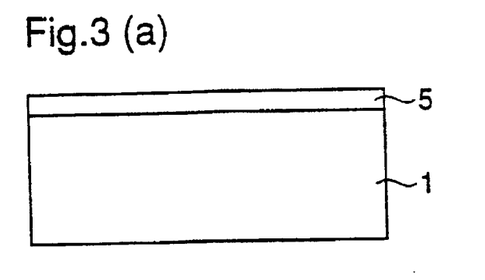
FIGS. 3(a)–3(f) are sectional views illustrating process steps in a method of fabricating a thin film SAW filter in accordance with a second embodiment of the present invention.

Initially, as shown in FIG. 3(a), the semiconductor electrode layer 5 containing a dopant impurity, such as Al, is epitaxially grown on the substrate 1 and, thereafter, the dopant impurity is activated by annealing to reduce the resistance of the electrode layer 5.

Then, a resist film 4 is deposited (FIG. 3(b)) and patterned to form a resist pattern 4b for electrodes (FIG. 3(c)). Using the resist pattern 4b as a mask, the semiconductor electrode layer 5 is etched by wet or dry etching (FIG. 3(d)), followed by removal of the resist pattern 4b (FIG. 3(e)), thereby producing the multifinger electrodes 5W and 5E. Thereafter, the piezoelectric layer 20 comprising the same semiconductor as the electrodes 5W and 5E is epitaxially grown on the surface of the substrate 1 including the electrodes 5W and 5E, resulting in the structure shown in FIG. 3(f).

Also in the SAW filter fabricated as described above, the crystal structure of the electrodes 5W and 5E is identical to the crystal structure of the piezoelectric layer 20, and the crystallinity of the piezoelectric layer 20 is not degraded by the electrodes 5W and 5E when it is grown.

In the fabricating method according to the second embodiment of the invention, the electrode layer 5 comprising a semiconductor doped with an impurity that reduces the resistance thereof is epitaxially grown on the substrate and etched to produce the electrodes 5W and 5E and, thereafter, the piezoelectric layer 20 comprising the same semiconductor and having the same crystal structure as the electrodes is epitaxially grown over the electrodes. Therefore, the structure in which the electrodes 5W and 5E are located at the interface between the substrate 1 and the piezoelectric layer 20 is realized without degrading the crystallinity of the piezoelectric layer 20. In this structure, when a high-frequency signal applied across the electrodes 5w and 5w' is converted into SAW, this SAW is directly transferred to the substrate 1. In addition, since the crystal structure of the electrodes 5W and 5E is identical to the crystal structure of the piezoelectric layer 20, there is little lattice-mismatch between the piezoelectric layer 20 and the electrodes 5W and 5E, and the crystallinity of the piezoelectric layer 20 is satisfactory. Therefore, unwanted degradation in the piezoelectric effect due to poor crystallinity of the piezoelectric layer 20 is avoided. As a result, a thin SAW filter with improved operating characteristics is easily fabricated.

[Embodiment 3]

Figure 4:
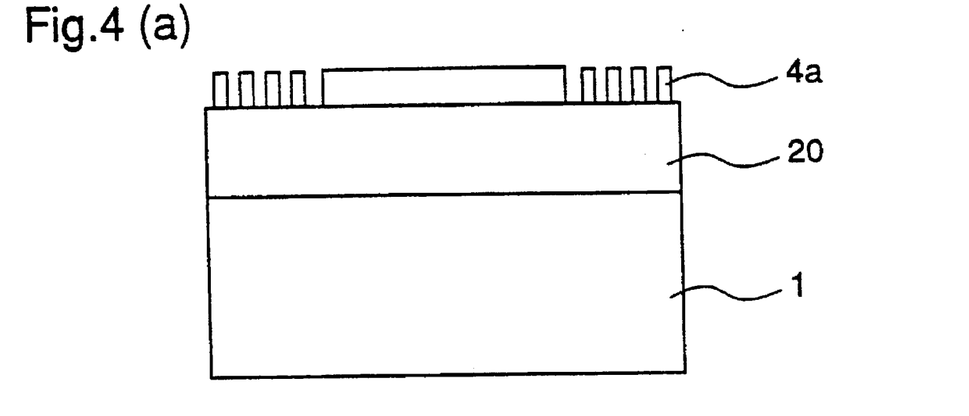
FIGS. 4(a)–4(c) are sectional views illustrating process steps in a method of fabricating a thin film SAW filter in accordance with a third embodiment of the present invention.

FIGS. 4(a)-4(c) are sectional views illustrating process steps in a method of fabricating a thin film SAW filter in accordance with a third embodiment of the present invention. The thin film SAW filter according to this third embodiment includes a double-stage electrode structure embedded in the piezoelectric layer.

A description is given of the fabricating method.

The process steps before the patterning of the resist film 4 are identical to those already described with respect to FIGS. 2(a) and 2(b) and, therefore, do not require repeated description. After the patterning of the resist film (FIG. 4(a)), and using the resist pattern 4a as a mask, a dopant impurity, such as Al, is ion-implanted into the piezoelectric layer 20 (first ion-implantation), forming first electrodes 5W and 5E on the interface between the substrate 1 and the piezoelectric layer 20 (FIG. 4(b)).

Subsequently, the dopant impurity is again ion-implanted into the piezoelectric layer 20 (second ion-implantation) at a different energy from that of the first ion-implantation, forming second electrodes 5W-2 and 5E-2 which are spaced apart from and aligned with the first electrodes 5W and 5E, respectively, followed by removal of the resist pattern 4a (FIG. 4(c)). Finally, the implanted ions are activated by annealing to reduce the resistance of the electrodes.

Figure 5:
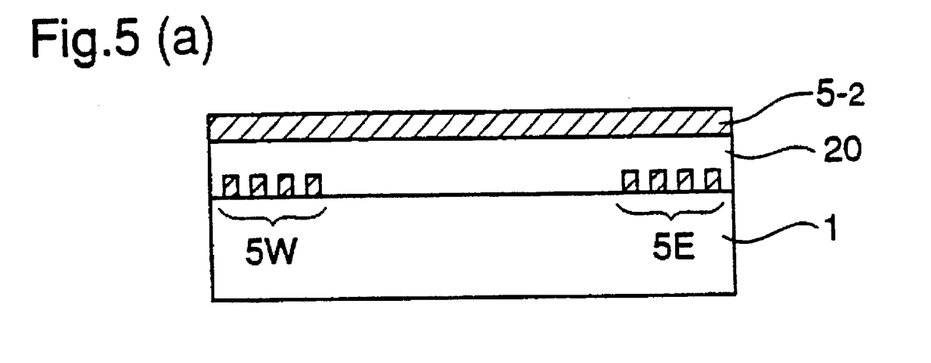
FIGS. 5(a)–5(c) are sectional views illustrating process steps in a method of fabricating a thin film SAW filter in accordance with a modification of the third embodiment of the present invention.

FIGS. 5(a)-5(c) are sectional views for explaining another method of fabricating the SAW filter according to a modification of the third embodiment.

In this modification, after the fabrication of the electrodes 5W and 5E on the interface between the substrate 1 and the piezoelectric layer 20 in the above-described first or second embodiment, a semiconductor electrode layer 5-2 containing a dopant impurity is epitaxially grown on the piezoelectric layer 20. Then, the dopant impurity is activated by annealing to reduce the resistance of the semiconductor electrode layer 5-2 (FIG. 5(a)).

Thereafter, a resist film is deposited and patterned to form a resist pattern 4c as shown in FIG. 5(b). Using the resist pattern 4c as a mask, the semiconductor electrode layer 5-2 is wet-etched or dry-etched to produce the second electrodes 5W-2 and the 5E-2.

After removal of the resist mask 4c, the piezoelectric layer 20 is epitaxially grown over the second electrodes 5W-2 and 5E-2, completing the structure shown in FIG. 5(c).

A multiple-stage electrode structure can be fabricated by changing the ion-implanting energy as described in the third embodiment of the invention or by repeating the process steps shown in FIGS. 5(a)-5(c) as described in the modification of the third embodiment.

In the third embodiment and the modification thereof, the first electrodes 5E and 5W are present at the interface between the substrate 1 and the piezoelectric layer 20 and the second electrodes 5W-2 and 5E-2 are present within the piezoelectric layer 20 at positions spaced apart from the first electrodes 5E and 5W, respectively. Therefore, in addition to the effects of the first and second embodiments, the piezoelectric effect occurs simultaneously at plural positions within the piezoelectric layer 20, whereby the piezoelectric efficiency is significantly increased.

[Embodiment 4]

In this fourth embodiment of the invention, after fabrication of the low-resistance semiconductor electrodes on the interface between the substrate 1 and the piezoelectric layer 20 or within the piezoelectric layer 20 as described in any of the first to third embodiments of the invention, additional electrodes are formed on the piezoelectric layer 20.

Figure 6:
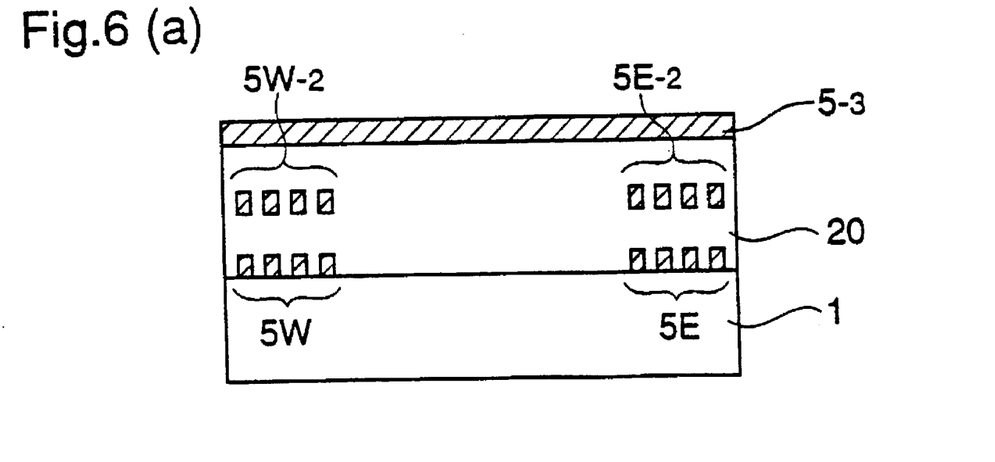
FIGS. 6(a)–6(c) are sectional views illustrating process steps in a method of fabricating a thin film SAW filter in accordance with a fourth embodiment of the present invention.

FIGS. 6(a)-6(c) are cross-sectional views for explaining process steps in a method of fabricating a thin-film SAW filter according to this fourth embodiment.

As illustrated in FIG. 6(a), on the piezoelectric layer 20 of the thin-film SAW filter according to, for example, the third embodiment of the invention, a semiconductor layer containing a dopant impurity is epitaxially grown, followed by annealing to activate the dopant impurity, thereby forming a low-resistance electrode layer 5-3. Thereafter, as illustrated in FIG. 6(b), a resist is deposited over the electrode layer 5-3 and patterned. Using the patterned resist 4 as a mask, the electrode layer 5-3 is etched to form electrodes 5W-3 and 5E-3.

While in this fourth embodiment the electrodes 5W-3 and 5E-3 are produced by epitaxial growth of a low-resistance semiconductor, these electrodes may be produced using a metal as in the prior art. In this case, a metal layer is formed on the piezoelectric layer 20 and the same resist pattern as shown in FIG. 6(b) is formed thereon. Using the resist pattern as a mask, the metal layer is dry-etched with Ar gas to form metal electrodes on the piezoelectric layer 20.

While in this fourth embodiment the electrodes 5W-3 and 5E-3 are produced by epitaxial growth and etching of the low-resistance semiconductor layer 5-3, similar electrodes can be produced by ion-implantation of a dopant impurity, such as Al, into a surface region of the piezoelectric layer 20 as described in the third embodiment of the invention.

Although in FIGS. 6(a)-6(c) the surface electrodes 5W-3 and 5E-3 are produced on the surface of the piezoelectric layer 20 including the double-stage electrodes 5W and 5E, and 5W-2 and 5E-2 according to the third embodiment of the invention, the structure of the base SAW filter is not restricted thereto. That is, the base SAW filter may includes more stages of electrodes within the piezoelectric layer 20 or a single-stage of electrodes on the interface between the substrate 1 and the piezoelectric layer 20.

As described above, according to the fourth embodiment of the present invention, after formation of the low-resistance semiconductor electrodes on the interface between the substrate 1 and the piezoelectric layer 20 or within the piezoelectric layer 20, the surface electrodes are formed on the surface of the piezoelectric layer 20. Therefore, in addition to the effects of the third embodiment, the piezoelectric effect occurs simultaneously at plural positions within the piezoelectric layer 20, thereby the piezoelectric efficiency is significantly increased.

What is claimed is:

1. A surface acoustic wave (SAW) filter comprising:

a monocrystalline substrate having a surface;

an epitaxial piezoelectric layer having a surface and comprising a semiconductor material disposed on the surface of the substrate; and first electrodes comprising parts of the piezoelectric layer at the interface between the substrate and the piezoelectric layer doped with a dopant impurity.

2. The SAW filter of claim 1 wherein the substrate comprises $\alpha\text{-}Al_2O_3$ and the piezoelectric layer comprises ZnO.

3. The SAW filter of claim 1 including surface electrodes disposed on the piezoelectric layer.

4. The SAW filter of claim 1 including second electrodes comprising parts of the piezoelectric layer, spaced apart from the first electrodes and doped with a dopant impurity.

5. The SAW filter of claim 4 wherein the substrate comprises $\alpha\text{-}Al_2O_3$ and the piezoelectric layer comprises ZnO.

6. The SAW filter of claim 4 including surface electrodes disposed on the piezoelectric layer.

* * * * *